United States Patent
Tam et al.

(10) Patent No.: US 6,307,432 B1
(45) Date of Patent: Oct. 23, 2001

(54) NON-INVERTING FEEDBACK AMPLIFIER WITH HIGH DISABLED IMPEDANCE

(75) Inventors: Kimo Y. F. Tam; Kenneth A. Lawas, both of Arlington, MA (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 09/497,981

(22) Filed: Feb. 4, 2000

Related U.S. Application Data
(60) Provisional application No. 60/160,781, filed on Oct. 21, 1999.

(51) Int. Cl.[7] ........................................ H03F 1/14
(52) U.S. Cl. ........................ 330/51; 330/69; 330/86
(58) Field of Search ........................... 330/51, 69, 86, 330/144

(56) References Cited

U.S. PATENT DOCUMENTS 3,628,129 * 12/1971 Riley ..................................... 323/100
3,629,719 * 12/1971 Heller ..................................... 330/69
3,885,220 * 5/1975 Fluegal ................................. 330/30 R

* cited by examiner

Primary Examiner—Robert Pascal
Assistant Examiner—Henry Choe
(74) Attorney, Agent, or Firm—Iandiorio & Teska

(57) ABSTRACT

A non-inverting feedback amplifier with high disabled impedance includes a disableable signal amplifier; a feedback network having an input node, a feedback node and a reference node; the signal amplifier having a first input for receiving an input signal and a second input for receiving a feedback signal from the feedback node; and a reference buffer including a reference amplifier with its output directly connected to the reference node without additional series switching elements, a first input connected to a reference voltage, and a second input connected to its own output for mirroring at its output the reference voltage at its first input when the reference buffer and signal amplifier are enabled and presenting a high impedance between the feedback network and the reference voltage when the signal amplifier and reference buffer are disabled.

7 Claims, 2 Drawing Sheets

NON-INVERTING FEEDBACK AMPLIFIER WITH HIGH DISABLED IMPEDANCE

RELATED APPLICATIONS

This application claims priority of U.S. Provisional Application Serial No. 60/160,781 filed on Oct. 21, 1999 entitled "NON-INVERTING FEEDBACK AMPLIFIER WITH HIGH DISABLED IMPEDANCE".

FIELD OF INVENTION

This invention relates to a non-inverting feedback amplifier with high disabled impedance.

BACKGROUND OF INVENTION

Many system architectures benefit from the ability to disable an amplifier when not in use. In addition to the savings in power, if the disabled amplifier can display a high output impedance, several amplifier outputs can be bussed together to provide more complex functionality. In one particular application, a video cross-point switch, arrays are built from smaller building blocks. In order to implement this array, the crosspoint building block outputs must be able to disable to a high impedance. Without this ability, impedance matching would not be possible, and power dissipation would be greatly increased. These amplifiers are often used to provide gain. A non-inverting gain of two is common, to compensate for the loss of one half the signal amplitude when driving a back-terminated load. For gains that are non-inverting, and not unity, a resistor divider is typically used to provide scaled feedback around the amplifier. This resistor divider must be connected between the output and a voltage reference, often ground. When the output amplifier is disabled (its output is made high-impedance), the feedback network still loads the output of the amplifier. Typically, the impedance of the feedback network is much less than that of the disabled amplifier's output. This is an unacceptable load on the output bus. In a non-inverting, non-unity gain configuration, the feedback network must be isolated from the output node in order to provide low disabled output impedance.

Several methods of isolating the feedback network have been investigated. In one approach an extra unity gain buffer stage is used to buffer the feedback network from the output. The buffer stage may be an operational amplifier connected as a voltage follower, but any gain of +1 stage is acceptable. The buffer stage is cascaded with the output of the main amplifier. This buffer stage must be capable of being disabled and it must be a very high quality buffer because it is directly in the signal path. This method allows a high-performance solution but at the expense of high area and power. In another application an additional disableable buffer is used to bootstrap the feedback network only when the channel is disabled. The buffer is often an operational amplifier configured as a voltage follower, but any unity gain stage is acceptable. The buffer mirrors the output voltage back to the feedback node (i.e. inverting input of the amplifier). In normal operation, this buffer is disabled. When the amplifier is disabled, this buffer is enabled. By maintaining zero volts across the feedback resistor connected to the output, the current into the output is zero for all externally applied output voltages. This results in a very large output impedance limited by the accuracy of the buffer so this buffer should be as accurate as possible.

In yet another approach a buffer is used in series with the feedback network near the output node. When enabled the buffer drives the feedback network with a replica of the output voltage, maintaining the closed-loop gain control. This buffer may be disabled when the main amplifier is disabled. It always isolates the feedback network from the output bus whether or not the channel is enabled. The buffer is often an operational amplifier configured as a unity gain amplifier, but can be any voltage follower stage. Again this buffer amplifier must be very accurate because any errors it introduces to the feedback loop will be reflected back to the main amplifier. In addition its presence in the feedback path makes the feedback loop more difficult to stabilize. Another solution is to isolate the feedback network from ground or another reference using a series switching element. In practice, a saturated bipolar transistor is often used for this case. But these transistors have large non-linear offset voltages and large switching times. The use of an FET gives somewhat better results but it has a non-linear on-resistance and is not available in bipolar fabrication processes.

SUMMARY OF THE INVENTION

It is therefore an object of this invention to provide an improved non-inverting feedback amplifier with high disabled impedance.

It is a further object of this invention to provide such an improved non-inverting feedback amplifier with high disabled impedance which uses a reference buffer amplifier which need not be extremely accurate, has less offset voltage and noise errors, requires less power because its output is virtually fixed, is disabled synchronously with the main amplifiers presenting a high-output impedance without use of a series switching element, has its parasitic capacitance isolated from the output by the feedback network, and is architecturally similar to the signal amplifier such that the two may share bias circuitry.

It is a further object of this invention to such an improved non-inverting feedback amplifier which reduces crosstalk when used in multiple-output integrated circuits.

It is a further object of this invention to provide such an improved non-inverting feedback amplifier which substantially increases disabled output impedance by a number of orders of magnitude approaching that of disabled unity gain amplifiers.

The invention results from the realization that a truly effective non-inverting feedback amplifier with high disabled impedance can be achieved using in addition to the main signal amplifier a second reference buffer which mirrors a reference voltage to the reference node of the feedback network when the reference buffer and signal amplifier are enabled and presents a high impedance between the feedback network and the reference voltage when the reference buffer and signal amplifier are disabled.

This invention features a non-inverting feedback amplifier with high disabled impedance including a disableable signal amplifier and a feedback network having an input node, a feedback node and a reference node. The signal amplifier has a first input for receiving an input signal and a second input for receiving a feedback signal from the feedback node. A reference buffer includes a reference amplifier with its output directly connected to the reference node without additional series switching elements, a first input connected to a reference voltage, and a second input connected to its own output for mirroring at its output the reference voltage at its first input when the reference buffer and signal amplifier are enabled and presenting a high impedance between the feedback network and the reference voltage when the signal amplifier and reference buffer are disabled.

In a preferred embodiment the signal amplifier may include a single amplifier circuit, it may include an operational amplifier and it may include a differential input. The feedback network may include resistor elements. The reference voltage may be ground, the reference amplifier may include a unity gain amplifier.

BRIEF DESCRIPTION OF THE DRAWINGS

Other objects, features and advantages will occur to those skilled in the art from the following description of a preferred embodiment and the accompanying drawings, in which.

Figures 1, 2:
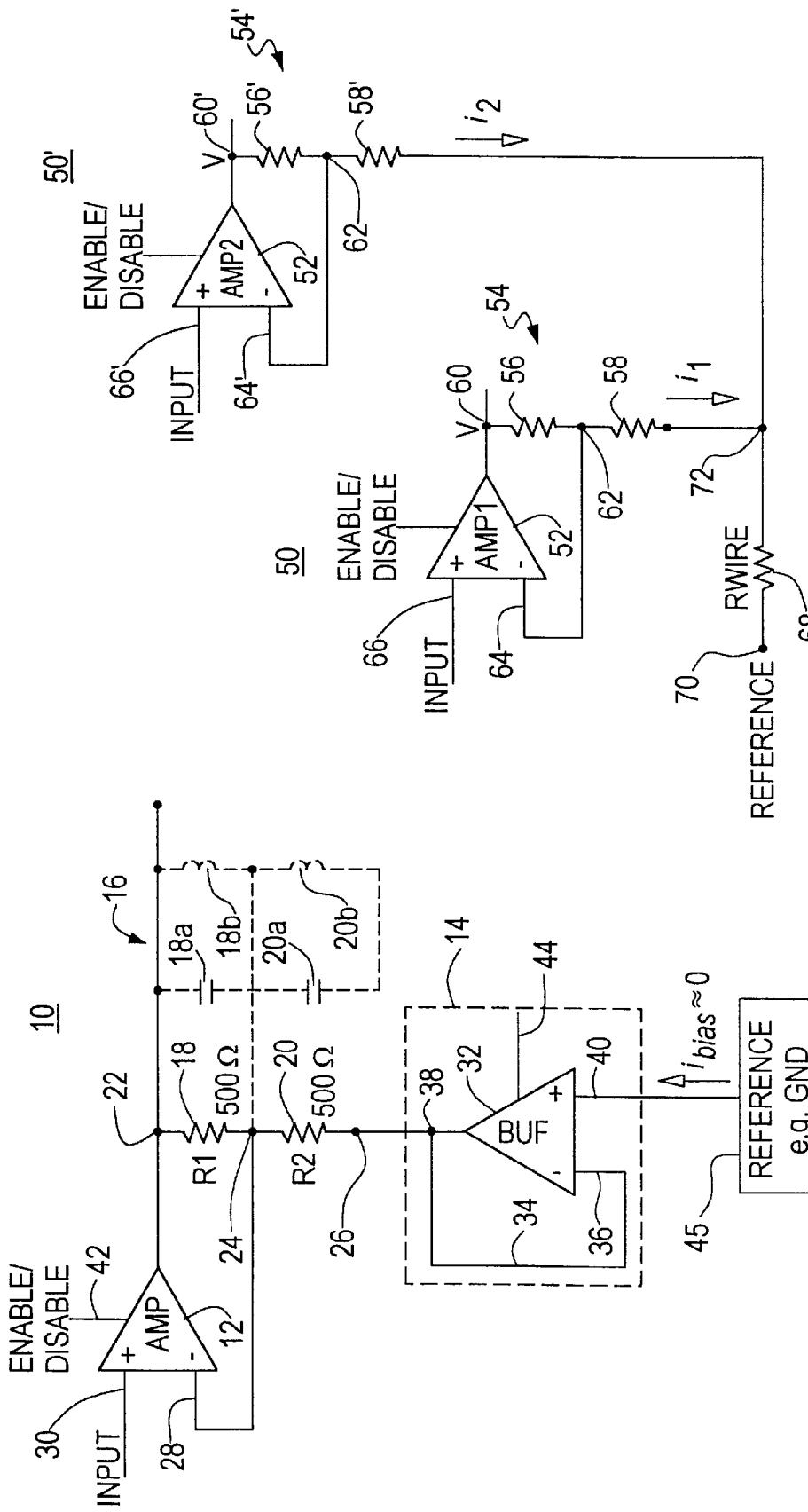
FIG. 1 is a schematic diagram of a non-inverting feedback amplifier with high disabled impedance according to this invention.
FIG. 2 is a schematic diagram of two prior art non-inverting feedback amplifiers connected to a reference voltage through a common impedance.

There is shown in FIG. 1 a non-inverting feedback amplifier with high disabled impedance 10 according to this invention including a main amplifier 12, a reference buffer 14 and feedback network 16. Feedback network 16 includes a pair of resistors 18 and 20 and has an output node 22, feedback node 24 and reference node 26. Output node 22 is connected to the output of amplifier 12 and constitutes the output of amplifier 10. Feedback node 24 is connected to the inverting input 28 of amplifier 12, the noninverting input 30 of which receives an input signal. Reference buffer 14 includes reference amplifier 32 and feedback loop 34 interconnected from the inverting input 36 to its output 38 which is directly connected only to reference node 26 of feedback network 16. The non-inverting input 40 of reference amplifier 32 is connected to a reference voltage 45, for example, as shown in FIG. 1, ground. Both main amplifier 12 and reference amplifier 32 can be enabled or disabled by a signal on lines 42 and 44, respectively. The two are enabled and disabled synchronously. That is, when amplifier 12 is enabled so is amplifier 32, and when amplifier 12 is disabled so is amplifier 32. This can be accomplished efficiently by sharing bias circuitry between the signal amplifier and reference buffer, simplifying the design.

In operation, the signal on input 30 to amplifier 12 is fed back through the feedback network 16 of resistors 18 and 20. This network need not be strictly resistance as it could be constructed of reactive impedances as well, for example, capacitances 18a and 20a or inductances 18b and 20b, or a combination of resistances, capacitances and inductances. However, capacitances do not resistively load the output and inductors are impractical. Assuming the use of resistances 18 and 20, and also assuming that they are equal, for example, 500 Ω each, the output at 22 will be halved as it appears at feedback node 24 so that one half the output voltage will appear at input 28 to amplifier 12. Amplifier 12 will then increase its output sufficiently to a factor of two so that the output 22 when halved will be equal at the input 28 to the input signal at input 30. When amplifier 12 and reference buffer 14 are enabled, amplifier 12 operates as just explained through feedback network 16. Amplifier 32 simply mirrors the reference voltage, e.g., ground, at its output 38 so that the reference voltage on input 40 is presented to the reference node 26. In this particular example node 26 is kept at ground. However, this is done without a current flow from the reference merely by the voltage mirroring action of reference buffer 32. Since reference buffer 14 need only mirror at its output 26 the voltage reference appearing at its input 40, it is not required to respond to a swinging input and may therefore be a simple and inexpensive implementation. When amplifiers 12 and 32 are disabled with a common signal, the disabled output impedance will appear to be extremely high, approaching infinity, because when buffer 14 is disabled it disconnects network 16 from the reference voltage at input 40 of amplifier 32, thus effecting an effective open circuit or infinite output impedance on disablement. This is achieved by debiasing the amplifier output stages without the inclusion of any additional series switching elements.

This is a particularly desirable and useful characteristic when a number of amplifiers 10 are used in a group such as in a video multiplexer switch which involves large switch arrays. For example, if the outputs of 1, 2 or n such amplifiers are connected to a common terminal and one operates while the others are disabled without sufficient provision such as herein taught, the impedance seen by the one enabled amplifier of the n total amplifiers will be equivalent to all of the output impedances seen in parallel. For example, if there are ten such amplifiers, all disabled, with 1000 Ω resistance in their feedback networks, this would appear to the eleventh enabled amplifier to be an impedance of only 100 Ω. This would be a severe loading of that enabled amplifier. This invention, as explained, prevents that occurrence.

The invention has a further advantage in such applications where two or more such amplifiers are connected through a common reference terminal to a common point: it reduces crosstalk. For example, in prior art devices as shown in FIG. 2, where for example two or more amplifiers 50, 50', are constructed without the reference buffer of this invention, crosstalk will occur. Thus in FIG. 2 amplifier 50 including signal amplifier 52 and feedback network 54 will cause a current $i_1$ to flow through resistances 56 and 58 of feedback network 54. As previously, the feedback network has an output node 60 connected to the output of amplifier 52 and a feedback node 62 connected to input 64' of amplifier 52. An input signal is delivered to amplifier 52 on input 66. In this configuration the current $i_1$ flowing through resistances 56 and 58 will continue to flow through the resistance of the wire 68 causing a difference in voltage between the reference point 70 and junction 72. This voltage which varies directly with the output of amplifier 52, will be reflected back to the neighboring amplifier 50', thus causing crosstalk and errors or artifacts in the video, for example. However, by employing the reference buffer of this invention the crosstalk can be eliminated. Amplifier 50', also results in a current $i_2$ which can produce crosstalk in amplifier 50 and which can be eliminated in the same way.

Figure 3:
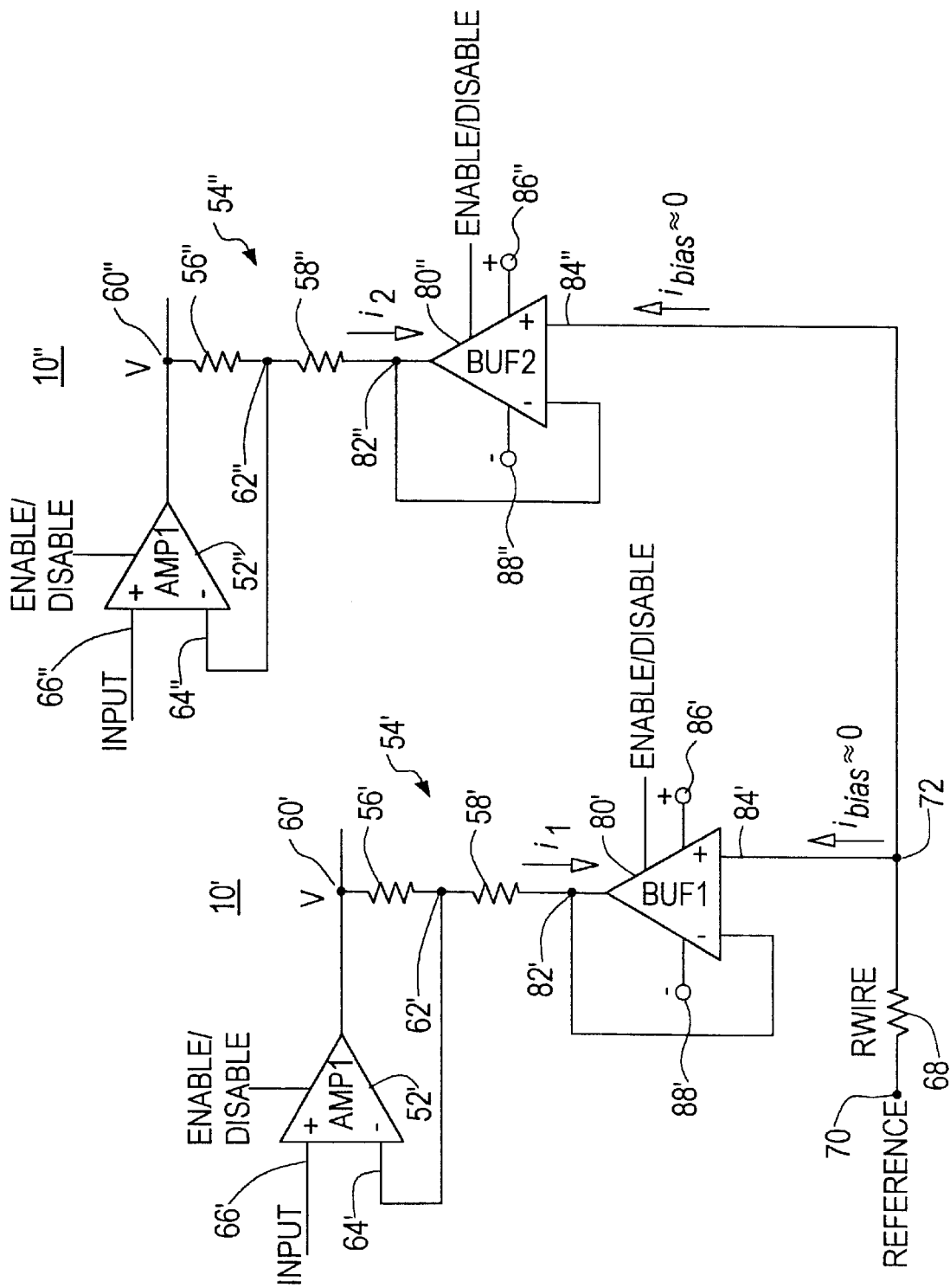
FIG. 3 is a schematic diagram similar to FIG. 2 but using the non-inverting feedback amplifiers with high disabled impedance according to this invention.

In keeping with this invention, when buffer 80' is added, FIG. 3, with its output connected to the reference node 82' at the output of buffer 80', and its input 84' connected to the reference voltage at 72, the buffer not only performs the functions as shown in FIG. I but in addition absorbs any current flow i, instead of passing it through to terminal 72. The current $i_1$ in the case of amplifier 10', or $i_2$ in the case of amplifier 10'', will flow into or out of reference buffer 80' and be absorbed by the power supply which is connected to the positive 86' and negative 88' power inputs to reference buffer 80', so that any currents will be absorbed by the power supply. Typically, amplifiers in these applications have a 1000X power rejection ratio which is sufficient to make any possible error negligible. While there may be a bias current $i_{bias}$, it will effectively be zero as shown because reference buffer 80' does not create a current path from terminal 72 to node 82'. Rather, it simply mirrors the reference voltage at terminal 72 so that it appears at reference node 82'.

The invention results in a substantial increase in the disabled impedance for noninverting feedback amplifiers having some non-inverting gain greater than unity. It should be understood that the feedback network 16, FIG. 1, including resistances 18 and 20 can be configured for any desired gain. For example, as shown with resistances 18 and 20 equal to one another, the gain would be two. If the resistances 18 and 20 were ratioed 1:2, for example; 500 Ω and 1000 Ω, respectively, then the gain would be three, and so on. This invention goes a long way toward the goal of having a disabled output impedance for an amplifier having a gain of greater than unity approach that of the disabled output impedance of unity gain amplifiers. Typically unity gain amplifiers may have a disabled output impedance of 20 MΩ while typical prior art unadjusted amplifiers would have a disabled output impedance of 1000 Ω. In contrast, this invention provides for an amplifier having a gain of two or more a disabled output impedance of 10 MΩ an increase of nearly four orders of magnitude.

Although specific features of the invention are shown in some drawings and not in others, this is for convenience only as each feature may be combined with any or all of the other features in accordance with the invention.

Other embodiments will occur to those skilled in the art and are within the following claims:

What is claimed is:

1. A non-inverting feedback amplifier with high disabled impedance comprising:

a signal amplifier;

a feedback network having an output node, feedback node and a reference node;

said signal amplifier having a first output for receiving an input signal and a second input for receiving a feedback signal from said feedback node; and a reference buffer including a reference amplifier with its output connected to said reference node, a first input connected to a reference voltage and a second input connected to its own output for mirroring at its output the reference voltage at its first input when said reference buffer and signal amplifier are enabled and said reference buffer presenting a high impedance between said feedback network and said reference voltage when said signal amplifier and reference buffer are disabled, wherein said signal amplifier and said reference voltage are disabled and enabled synchronously.

2. The non-inverting feedback amplifier with high disabled impedance of claim 1 in which said signal amplifier includes a single amplifier circuit.

3. The non-inverting feedback amplifier with high disabled impedance of claim 1 in which said signal amplifier includes an operational amplifier.

4. The non-inverting feedback amplifier with high disabled impedance of claim 1 in which said signal amplifier includes a differential input.

5. The non-inverting feedback amplifier with high disabled impedance of claim 1 in which said feedback network includes resistor elements.

6. The non-inverting feedback amplifier with high disabled impedance of claim 1 in which said reference voltage is ground.

7. The non-inverting feedback amplifier with high disabled impedance of claim 1 in which said reference amplifier includes a unity gain amplifier.

\* \* \* \* \*